United States Patent [19]

Woods, Jr. et al.

[11] Patent Number: 4,967,147
[45] Date of Patent: Oct. 30, 1990

[54] CIRCUIT TESTER HAVING MECHANICAL FINGERS AND POGO PROBES FOR CAUSING ELECTRICAL CONTACT WITH TEST FIXTURE ASSEMBLIES

[75] Inventors: Ernest C. Woods, Jr., Pleasant Hill; John B. Burnett, Vacaville, both of Calif.

[73] Assignee: Zehntel, Inc., Walnut Creek, Calif.

[21] Appl. No.: 199,016

[22] Filed: May 26, 1988

[51] Int. Cl.⁵ .................... G01R 5/28; G01R 19/00
[52] U.S. Cl. .................... 324/158 F; 324/158 P
[58] Field of Search ........... 324/158 P, 158 F, 73 PC, 324/72.5; 439/482

[56] References Cited

U.S. PATENT DOCUMENTS

| | | | |
|---|---|---|---|
| 3,824,462 | 7/1974 | Vinsani | 324/158 F X |
| 4,230,985 | 10/1980 | Matrone et al. | 324/73 PC |
| 4,357,062 | 11/1982 | Everett | 324/158 F |
| 4,514,786 | 4/1985 | Charruau | 324/73 PC |
| 4,536,051 | 8/1985 | Smith et al. | 324/158 F X |
| 4,544,886 | 10/1985 | Murray et al. | 324/158 F |
| 4,651,090 | 3/1987 | Heigl | 324/73 PC |
| 4,724,377 | 2/1988 | Maelzer et al. | 324/158 F |
| 4,746,861 | 5/1988 | Nesbitt | 324/158 P X |
| 4,771,234 | 9/1988 | Cook et al. | 324/158 F |
| 4,875,006 | 10/1989 | Henley et al. | 324/158 D |
| 4,884,024 | 11/1989 | Di Perna | 324/158 F |

Primary Examiner—Reinhard J. Eisenzopf
Assistant Examiner—Vinh P. Nguyen
Attorney, Agent, or Firm—Arnold, White & Durkee

[57] ABSTRACT

A test system for testing high density printed circuit boards with large numbers of integrated circuits. The system is especially suited for testing large scale integrated circuits. The overall test system comprises two principal parts: a cabinet supporting a large number of driver/receiver printed circuit boards and a test fixture supporting a printed circuit board under test. The test fixture connects to the cabinet by a number of pull-down fingers automatically operated by an electromechanical means. Two large arrays of electrical contacts are precisely mated together by the operation of the pull-down fingers. When a printed circuit board of a different layout is required to be tested, the test fixture is exchanged for a test fixture wired in conjunction with the new layout. A feature is the large number of driver/receiver boards able to communicate with the printed circuit board under test, while the lead lengths between the driver/receiver boards and the printed circuit board under test, are kept to a minimum. Another feature is the quick easy way the test fixtures may be exchanged on the test cabinet. A particular aspect of the system lies in the mechanical pull-down fingers which are utilized to pull down the test fixture onto the cabinet platen surface.

20 Claims, 12 Drawing Sheets

CIRCUIT TESTER HAVING MECHANICAL FINGERS AND POGO PROBES FOR CAUSING ELECTRICAL CONTACT WITH TEST FIXTURE ASSEMBLIES

BACKGROUND AND SUMMARY OF THE INVENTION

The present invention relates generally to a printed circuit board test system having a removable test fixture assembly and more particularly to a mechanical pull-down system which locates and retains the test fixture in precise electrical and mechanical contact with the main body of the printed circuit board test system. The invention further relates to connectors for interconnecting the test fixture assembly with a driver/receiver circuit board in the main body of the test system.

Today, integrated circuits are complex electronic devices, such as complete microprocessors in single integrated circuit packages. Switching speeds of digital integrated circuits have increased and frequency bandwidths of analog integrated circuits have increased. Printed circuit board design uses these advances in integrated circuit technology. Consequently, a printed circuit board may be a very complex component to test.

To test fast, complex electronic printed circuit boards, a test system must be capable of sending input stimuli to a large number of test nodes on a printed circuit board under test. The test system must be capable of accurately monitoring the responses received from the input stimuli at a sufficient number of strategic locations on the printed circuit board under test. The speed of data transmission to and from the printed circuit board should be at least as fast as the highest speed at which the printed circuit board is designed to operate, and the quality of data transmission should involve a minimum of distortion to a data signal.

To communicate with large numbers of test nodes, a printed circuit board test system requires a large number of interconnecting leads, insulated conductors, to transmit data between a number of driver/receiver boards and the test nodes on the printed circuit to be tested. To satisfy the high speed requirements in a printed circuit board test system, the interconnecting leads should be as short as practically possible.

A printed circuit board test system generally has two main parts: a main frame, or cabinet, and a test fixture assembly. The cabinet contains a number of driver/receiver boards under the control of a microprocessor and associated software. The test fixture assembly contains interconnecting leads which connect the driver/receiver boards to the test nodes on the printed circuit board to be tested. The test fixture assembly is removable from the cabinet since a test fixture assembly is unique to each particular printed circuit board layout being tested.

In the past, when less stringent performance was required, the interconnecting leads were fed through the test fixture assembly. This design left the underside of the test fixture assembly clean to make a vacuum seal, enabling a vacuum means to pull down the test fixture onto the main test assembly. The vacuum technique was convenient and relatively inexpensive. However, testing large scale integrated circuit technology (LSI) requires many more driver/receiver boards and thus more interconnecting leads. The interconnecting leads are attached to the underside of the test fixture assembly in order to keep them as short as possible. Since the underside of such a test fixture assembly is not clear because of the interconnecting leads and terminals protruding from the surface, vacuum pull-down techniques are unsuitable.

Thus, a need has existed for a reliable means to pull down a test fixture assembly onto the main test assembly. A need has also existed for such a pull-down means to allow quick and easy interchanges of test fixture assemblies, and to allow quick and easy interchanges of printed circuit boards being tested. Finally, a need has existed to shorten the interconnecting leads.

A printed circuit board test system according to the present invention has a cabinet containing a plurality of driver/receiver printed circuit boards. A platen rigidly attached to the cabinet locates and supports a plurality of driver/receiver connectors. Each driver/receiver connector makes electrical connection with an associated driver/receiver printed circuit board which, in turn, plugs into either side of a back plane. The back plane is rigidly supported in the center of the cabinet. With all the driver/receiver connectors plugged into their respective driver/receiver printed circuit boards, the driver/receiver connectors' upper surfaces form two terminal arrays along opposite sides of the platen.

Projecting from the platen, and protruding between and above the driver/receiver connectors' upper surfaces are a number of pull-down fingers, which are arranged to receive a test fixture assembly. Each test fixture assembly has a test fixture and fixture interface attached to either side of the text fixture. Each fixture interface contains an array of insulation displacement devices. The pull-down fingers are operable to pull down a test fixture assembly until the array of insulation displacement devices make electrical and physical contact with the terminal arrays formed by the driver/receiver connectors' upper surfaces. The test fixture of the test fixture assembly has a plurality of fixture spring-loaded pogo probe connectors protruding from its top surface. The fixture pogo probe connectors are arranged to make physical and electrical contact with a plurality of predetermined nodes on the solder side of the printed circuit board under test. The test fixture assembly also has fixture alignment pins which also protrude through and above the top surface of the test fixture assembly. The fixture alignment pins determine the precise location on the test fixture of a printed circuit board to be tested.

The fixture pogo probe connectors are wired to electrically connect predetermined nodes on the solder side of a printed circuit board under test to appropriate insulation displacement devices in the fixture interfaces. The test fixture assembly wiring is unique for each unique printed circuit board under test.

The insulation displacement devices in each fixture interface are arranged to mate with an array of driver/receiver pogo probe connectors positioned along the upper surfaces of the driver/receiver connectors. An opposite surface of the driver/receiver connector comprises a card-edge connector. Each driver/receiver probe connector has a separate internal wire or other conductive element which leads to a separate contact on the card-edge connector. The card-edge connector is a socket-type connector. In another feature of the invention, the card-edge connector is a plug-type connector.

To test a series of identical printed circuit boards, the operator places a test fixture assembly onto the pulldown fingers in their raised position, and above platen alignment pins. The pull-down fingers move away from under the test fixture assembly, allowing the test fixture assembly to fall, guided by the platen alignment pins. The pull-down fingers then move back over the test fixture assembly and pull the test fixture assembly down, causing the two arrays of insulation displacement devices to mate with the two terminal arrays formed by the driver/receiver connectors' upper surfaces.

The operator places the printed circuit board to be tested over the fixture alignment pins protruding from the top surface of the test fixture. A vacuum or other conventional means pulls down the printed circuit board to contact the fixture pogo probe connectors protruding from the surface of the test fixture. After the board has been tested, the operator releases the board, removes it from the test fixture, and places the next board to be tested on the test fixture.

To test a printed circuit board with a different layout, the operator must replace the first test fixture assembly with a second test fixture assembly which is wired for the new layout. The operator activates the pull-down fingers, which release the first test fixture assembly, rotate beneath the first test fixture assembly, and then support the first test fixture assembly in electrical isolation from the driver/receiver connectors. The operator removes the first test fixture assembly and places the second test fixture assembly onto the raised pull-down fingers and over the platen alignment pins. The pull-down fingers then operate to pull down the second test fixture assembly to cause the insulation displacement devices of the test fixture assembly to make electrical contact with the driver/receiver probe connectors.

BRIEF DESCRIPTION OF THE DRAWINGS

The above-noted and other aspects of the present invention will become more apparent from a description of the preferred embodiment when read in conjunction with the accompanying drawings.

The drawings illustrate the preferred embodiment of the invention, wherein like members bear like reference numbers and wherein.

DETAILED DESCRIPTION OF THE PREFERRED EMBODIMENT

Figure 1:
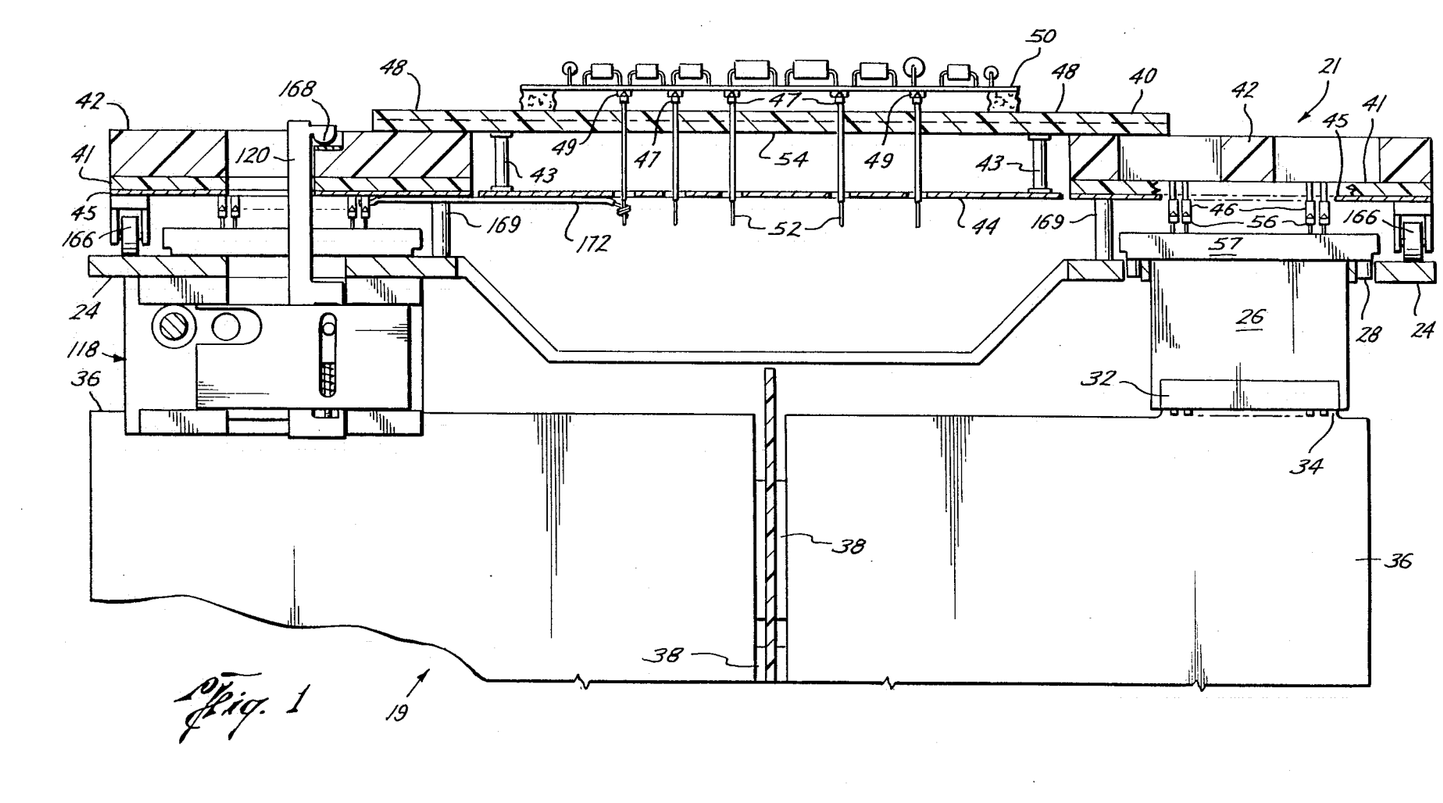
FIG. 1 is a partially-sectioned side view of a printed circuit board test system illustrating a pull-down finger assembly in a pulled-down position and a driver/receiver connector located on a driver receiver board and in contact with an interface connector.
Figure 2:
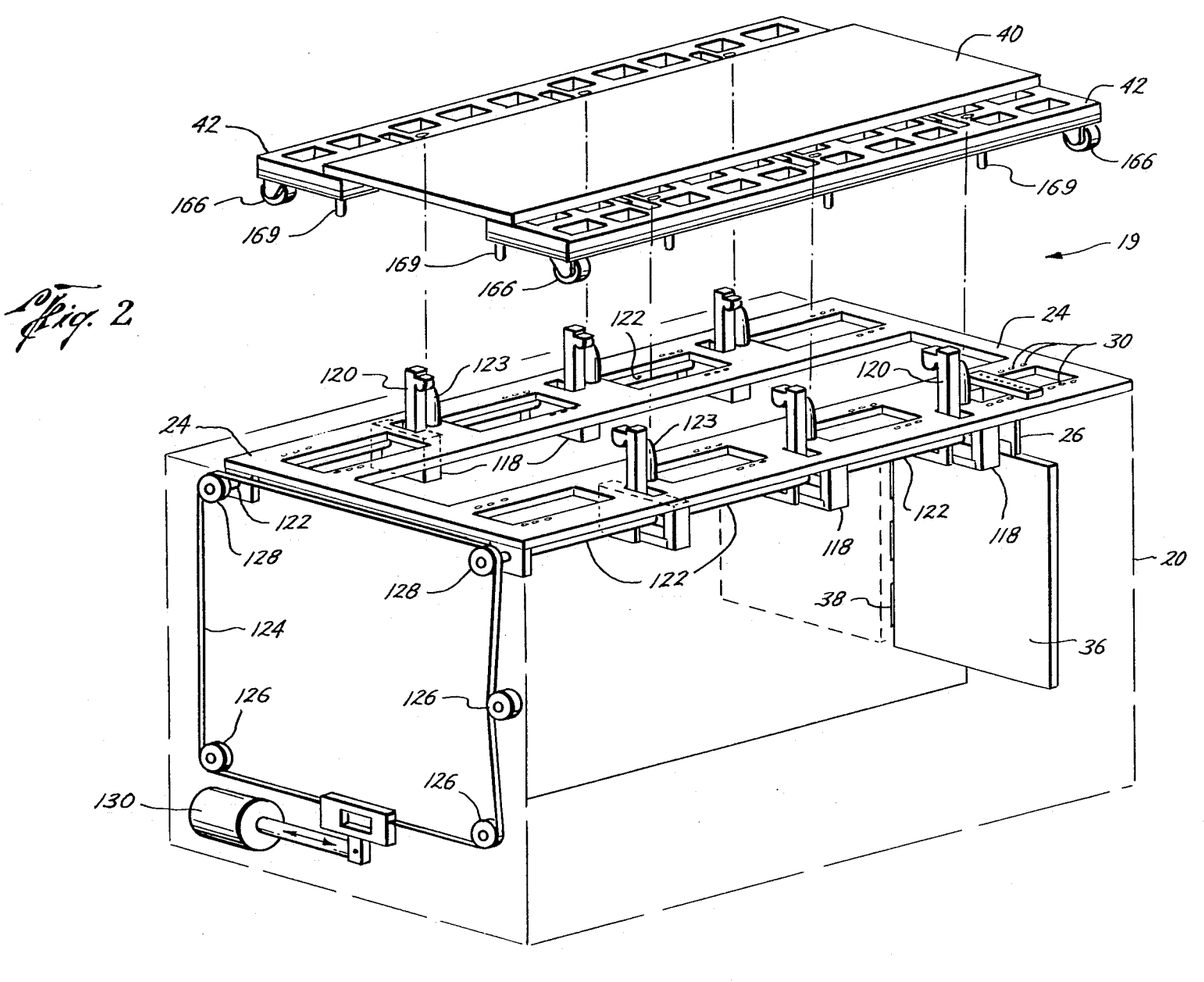
FIG. 2 is a perspective partially exploded view of a cabinet having a pull-down finger assembly.
Figure 4:
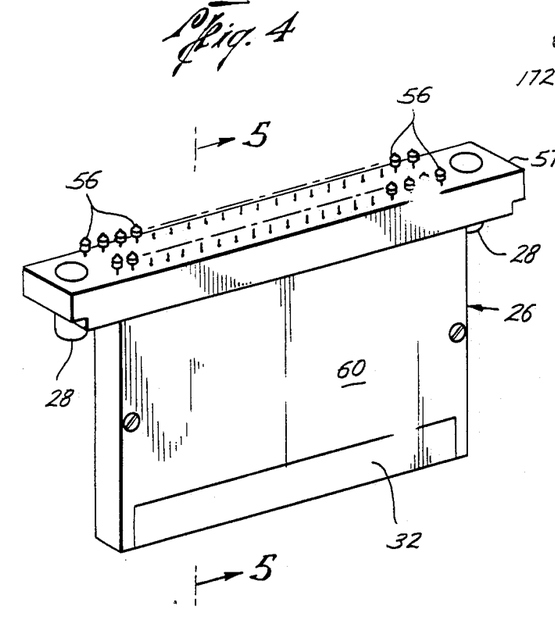
FIG. 4 is a perspective view of a driver/receiver connector.
Figures 4, 5:
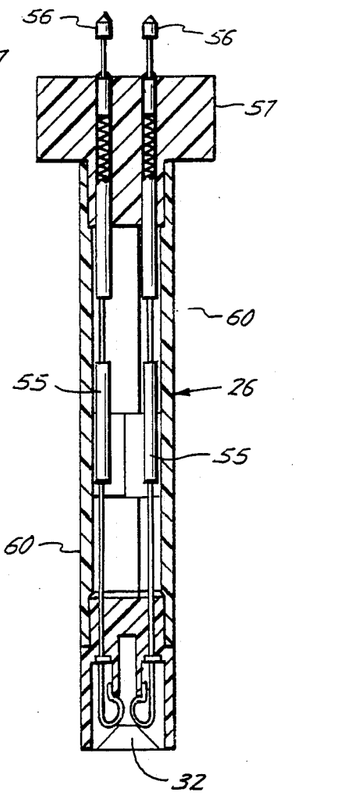

FIGS. 1 and 2 illustrate a test system 19. The test system 19 has a test cabinet 20 and a test fixture assembly 21. The test cabinet 20 has a back plane assembly 22 and a platen 24. The platen 24 supports a plurality of driver/receiver connectors 26. The driver/receiver connectors have lugs 28 (depicted in FIGS. 4 and 9) which locate with holes 30 in the platen 24. The bottom end of each driver/receiver connector 26 protrudes through its respective opening in the bottom of the platen 24. The protruding bottom end of each driver/receiver connector 26 has a card-edge connector socket 32 which electrically connects with a card-edge connector 34 extending from the top side of a driver/receiver printed circuit board 36. The card-edge connector 34 is a plug-type card-edge connector. A plurality of driver/receiver printed circuit boards 36 plug into a plurality of back plane card-edge connectors 38 which are part of the back plane assembly 22. The driver/receiver printed circuit boards 36 extend out from both sides of the back plane assembly 22. With each driver/receiver printed circuit board 36 having its own driver/receiver connector 26, the test cabinet has two rows of driver/receiver connectors. The top ends of the driver/receiver connectors 26 extend above the surface of the platen 24.

Figure 14:
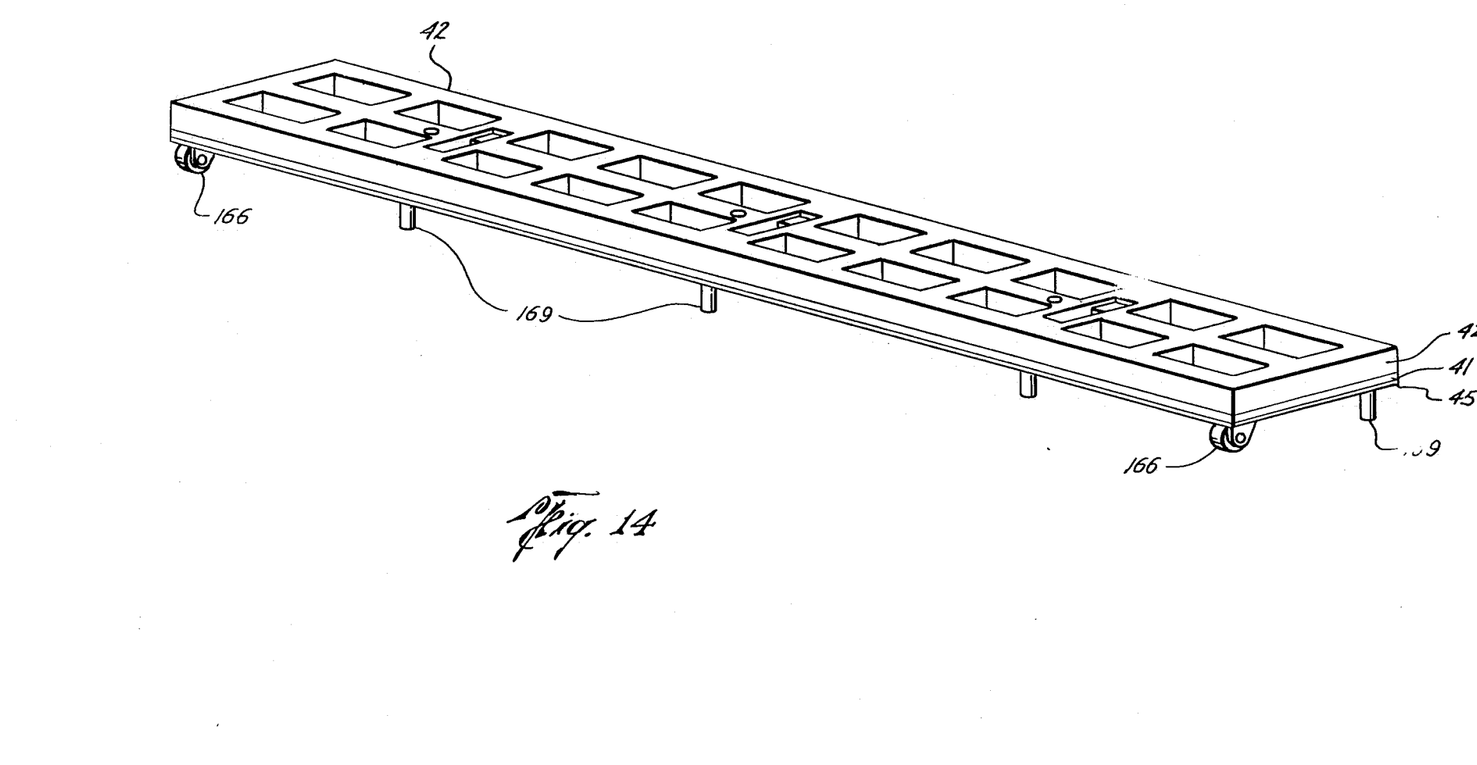
FIG. 14 is a perspective view of a fixture interface illustrating a stiffener, travel stops, and rollers.

The test fixture assembly 21 includes a test fixture 40 and two fixture interfaces 41. Referring now to FIG. 14, each fixture interface 41 has a stiffener frame 42, which rigidly connects the fixture interface 41 to the test fixture 40. Each fixture interface 41 has limited movement about the plane of its stiffener frame 42 to allow for manufacturing tolerances in the test fixture 40.

Referring now to FIG. 1, the test fixture assembly 21 has ground plane supports 43 and a test fixture ground plane 44. The ground plane supports 43 connect the test fixture ground plane 44 to the test fixture 40. The test fixture ground plane 44 is on the same level as fixture interface ground planes 45, also part of the test fixture assembly 21, which cover the lower surface of the fixture interfaces 41. Jumper leads, not shown, electrically connect ground planes 44 and 45 to form a continuous ground plane.

Figure 5A:
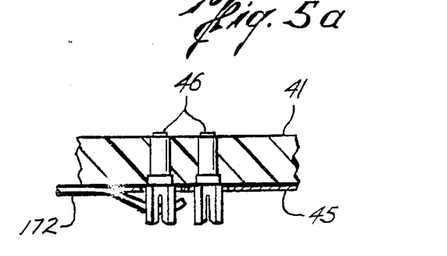
FIG. 5a illustrates a sectional view through the driver/receiver connector of FIG. 4 taken along the lines 5—5. A corresponding partial sectional view through a fixture interface is also shown to illustrate how a driver/receiver spring-loaded probe connector mates with an insulation displacement device. For clarity, the fixture interface is illustrated displaced above the driver/receiver spring-loaded probe connectors before being pulled down by pull-down finger assemblies.
Figure 5B:
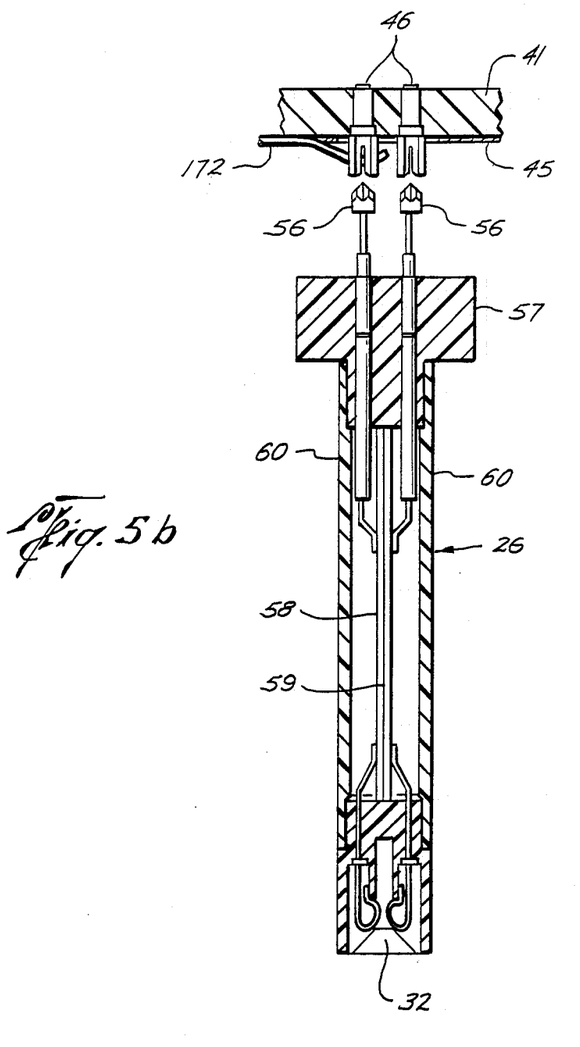
FIG. 5b illustrates similar sectional views to FIG. 5a, but wherein an alternative embodiment uses a printed circuit board as a conductor interconnecting each card-edge connector contact with a respective spring-loaded probe connector.
Figure 6:
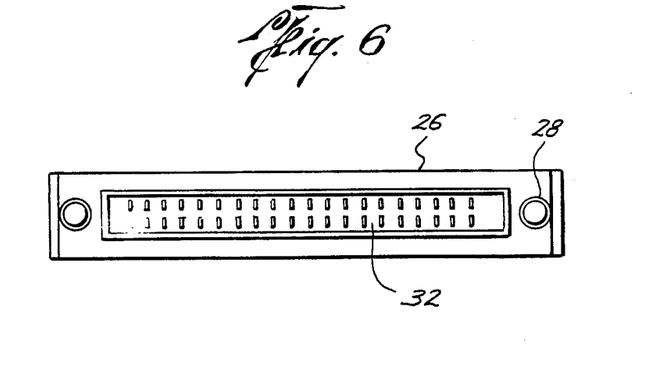
FIG. 6 is a bottom view of the driver/receiver connector of FIG. 4, illustrating the card-edge connector socket.
Figure 9:
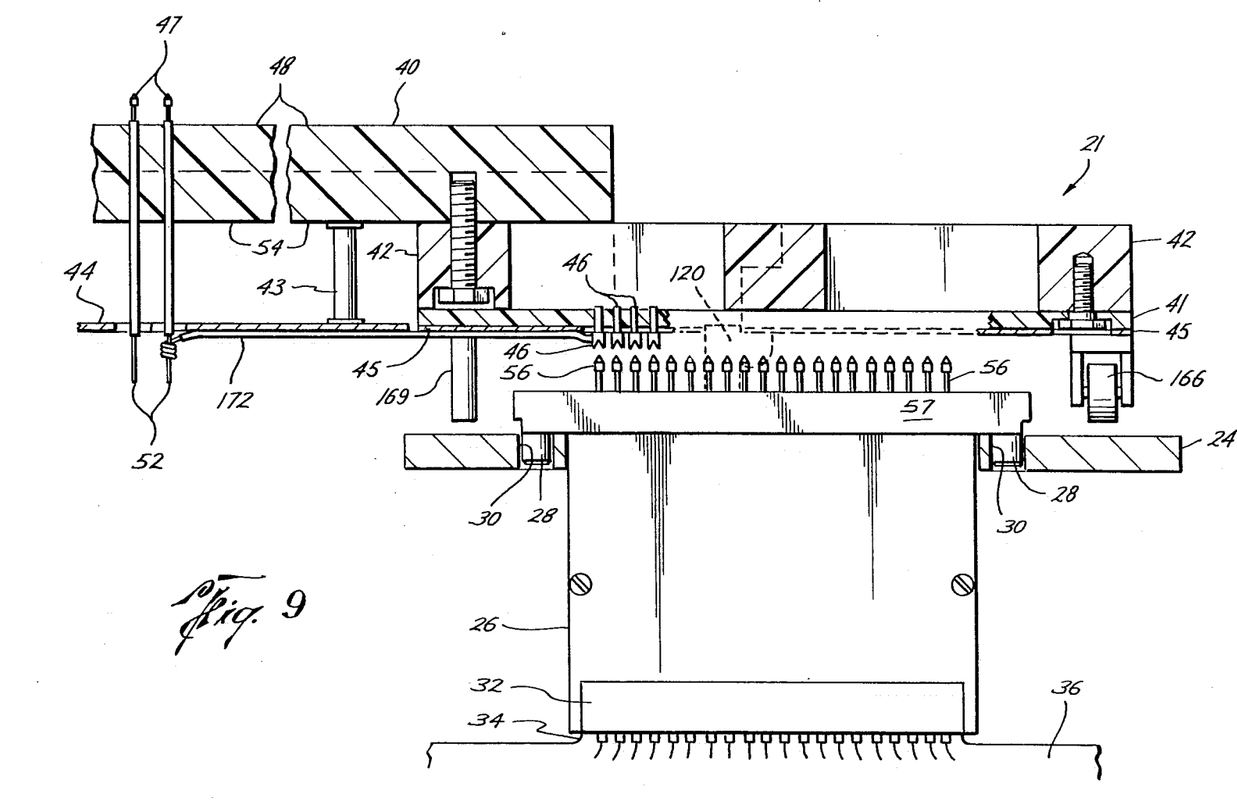
FIG. 9 is a partial sectional view through the platen illustrating one of the driver/receiver connectors in location on the platen with the corresponding driver/receiver board plugged into the card-edge connector end of the driver/receiver connector. Also illustrated are insulation displacement devices of one of the fixture interfaces, and a conductor connected between a wire-wrap post and one of the insulation displacement devices.
Figure 10:
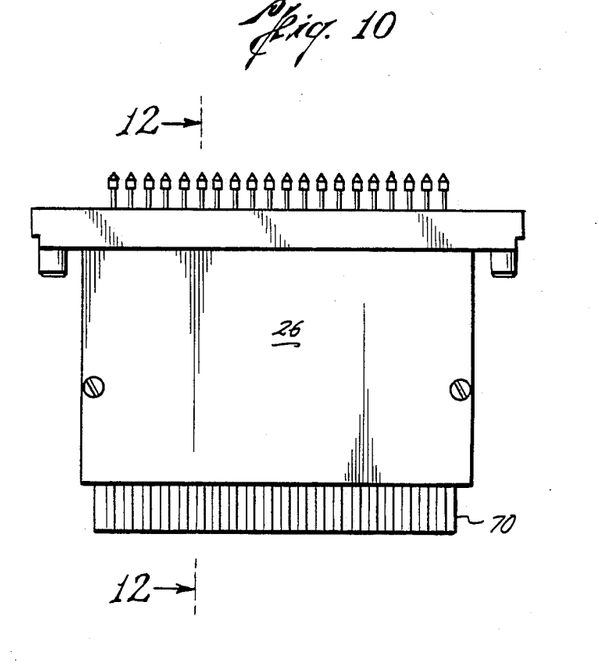
FIG. 10 is a side view of a driver/receiver connector having a card-edge connector plug as an alternative embodiment to the card-edge connector socket as illustrated in FIGS. 4, 5 and 6.
Figure 11:
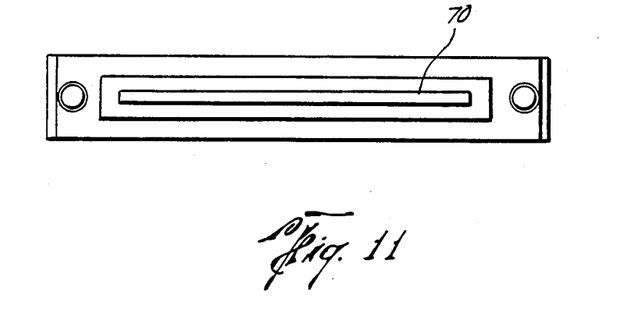
FIG. 11 is an end view of FIG. 10.

Referring to FIGS. 5a and 5b, each fixture interface 41 has a plurality of insulation displacement devices 46, an example of which are "lancer terminals," which protrude from the lower surface of the fixture interface 41. The fixture interface ground plane 45 and the insulation displacement devices 46 are physically separated for electrical isolation between them. Referring to FIGS. 1 and 9, spring-loaded fixture pogo probe connectors 47 protrude in their normally extended condition from the upper surface 48 of the test fixture. The pogo probe connectors 47 contact specific nodes 49 on a printed circuit board 50 under test. Fixture alignment pins 51 align the board 50 on the test fixture 40. The opposite ends of the fixture pogo probe connectors 47 are wire-wrap posts 52 which extend from the lower surface 54 of the test fixture 40 and protrude through appropriate holes in the test fixture ground plane 44. The holes in the ground plane are sufficiently large for electrical isolation from the wire-wrap post 52.

Referring to FIGS. 4, 5a, 5b, and 6, the driver/receiver connector 26 has, at a bottom end, a card-edge connector socket 32 having a plurality of separate contacts. In the preferred embodiment, FIG. 5a, a separate conductive element 55 connects each separate contact of the card-edge connector socket 32 to an associated spring-loaded driver/receiver pogo probe connector 56 multi-probe terminal block 57 located at the top end of the driver/receiver connector 26. FIG. 5b depicts an alternate embodiment of the driver/receiver connector 26 having a multilayered printed circuit board 58 in place of the conductive element 55. The printed circuit board 58 has a ground plane 59 to reduce electrical noise. A backshell 60 adds mechanical support and electrical protection to both sides of the driver/receiver connector 26.

Figure 12A:
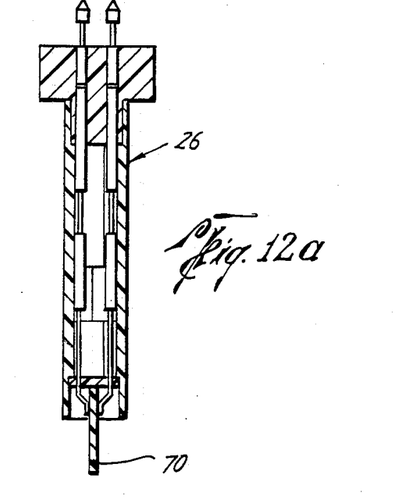
FIG. 12a is a sectional view through the driver/receiver connector of FIG. 10 taken along the lines 12—12.
Figures 12B, 13:
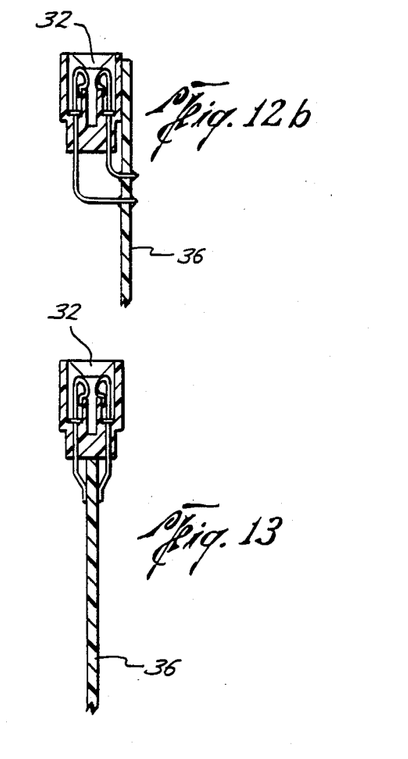
FIG. 12b illustrates the connection between a card-edge connector socket and a driver/receiver board.
FIG. 13 illustrates an alternative embodiment of the connection shown in FIG. 12b between the card-edge connector socket and the driver/receiver board.

FIGS. 10, 11, 12a, 12b, and 13 depict another alternate embodiment of the driver/receiver connector 26. In this configuration a card-edge connector plug 70 replaces the card-edge connector socket 32 of FIG. 6. The card-edge connector socket 32 attaches to the driver/receiver board 36 with a side connection as illustrated in FIG. 12b. In an alternate embodiment the socket 32 attaches with an in-line connection as illustrated in FIG. 13.

Referring now to FIG. 9, in the preferred embodiment of the invention, the top surfaces of each row of the driver/receiver connectors 26 form an array of driver/receiver probe connectors 56. The insulation displacement devices 46 are also arranged in arrays, such that the test fixture assembly 21 has two arrays of insulation displacement devices 46 which are mirror images of the two arrays of driver/receiver probe connectors 56 protruding above the surface of the platen 24. By precisely placing the test fixture assembly 21 onto the platen 24, each driver/receiver probe connector 56 will locate with a corresponding insulation displacement device 46 on the fixture interface 41.

The user may decide not to use a full complement of driver/receiver boards. The vacant slots in the platen corresponding to the absent driver/receiver connectors 26 may be filled by installing a driver/receiver filler, not shown. A driver/receiver filler is a blank terminal block 57 with the lugs 28.

Figures 3A, 3B:
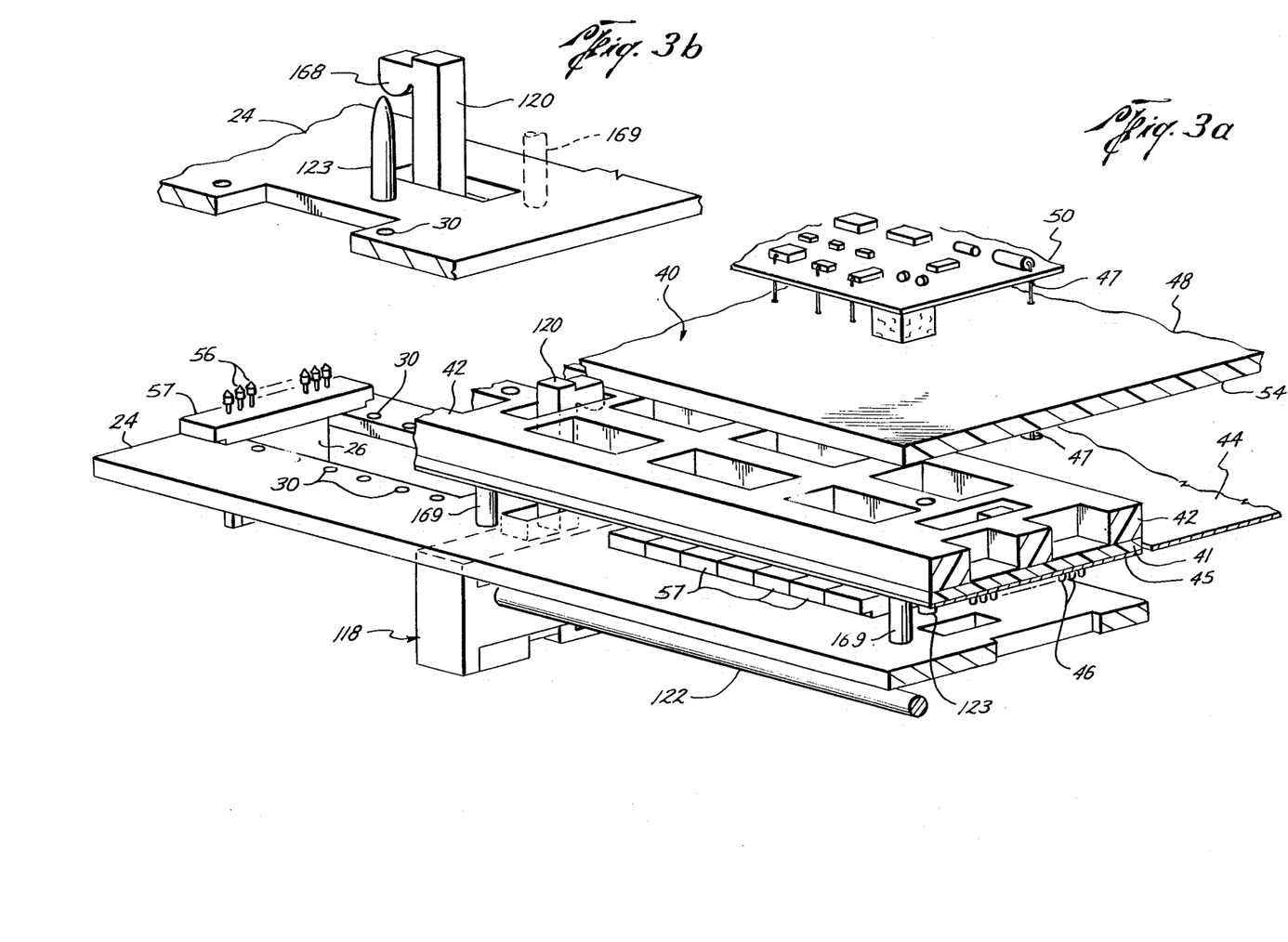
FIG. 3a is a partial close-up view of a platen illustrating a driver/receiver connector and a pull-down finger in location.
FIG. 3b is a partial close-up view depicting a platen alignment pin which was hidden in FIG. 3a. by the pull-down finger.
Figure 8:
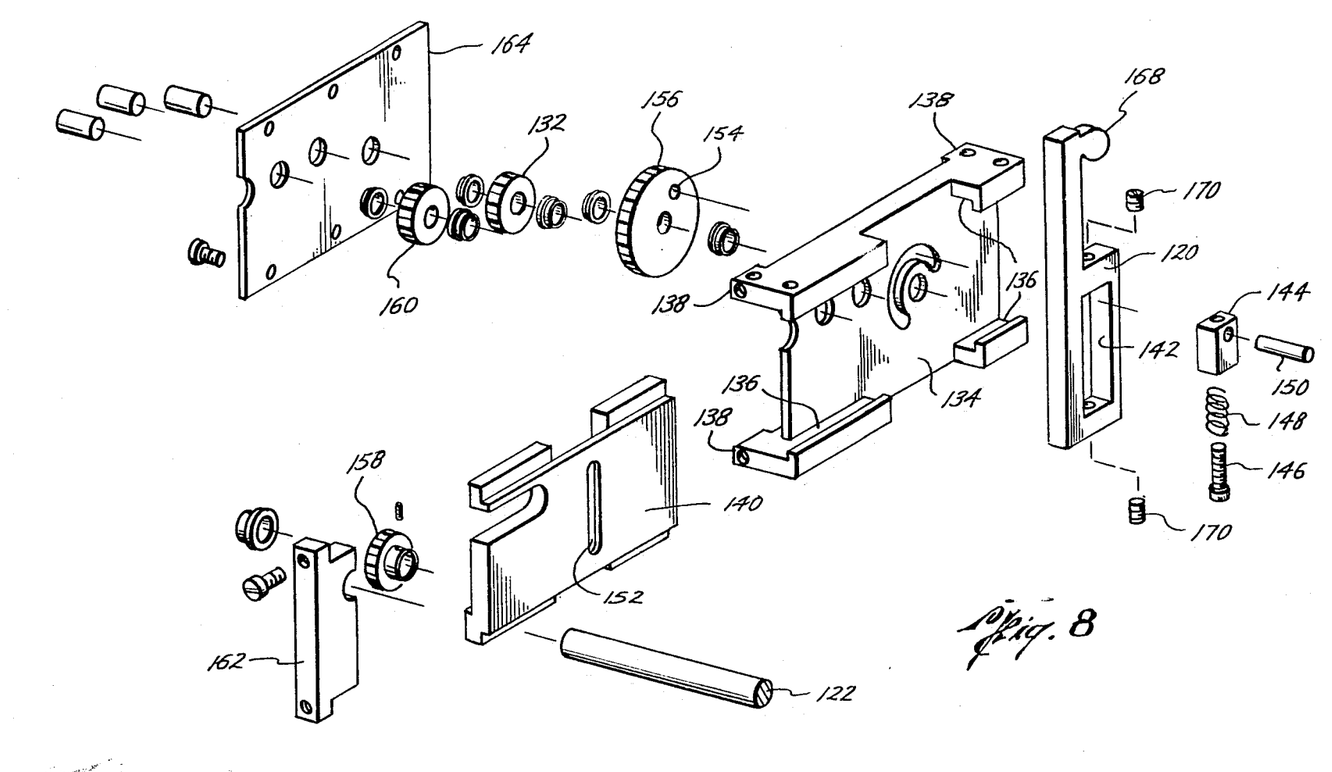
FIG. 8 is an exploded view of a pull-down finger assembly with a reversing gear.

Referring to FIG. 2, the platen 24 has three pull-down finger assemblies 118 on one side of the test fixture 40 and three pull-down finger assemblies on the other side. Referring to FIG. 3, a finger 120 protrudes from each pull-down finger assembly 118 through its respective hole in the platen, in a position to receive the test fixture assembly 21. Each group of three pulldown finger assemblies 118 has a common shaft 122. The two shafts 122 are rotated by a chain 124. The chain 124 rides on sprockets 126 and 128. Each sprocket 128 is rigidly fixed to its respective shaft 122. A linear actuator 130 moves the chain 124 in either direction. The chain 124 moves in one direction to load the test fixture and in the opposite direction to unload the test fixture. Since the two shafts 122 rotate in unison and the two rows of pull-down finger assemblies 118 operate facing one another, the pull-down finger assemblies on one shaft have an additional gear wheel which is a reversing gear wheel 132. The reversing gear wheel 132 is depicted in FIG. 8.

Figure 7:
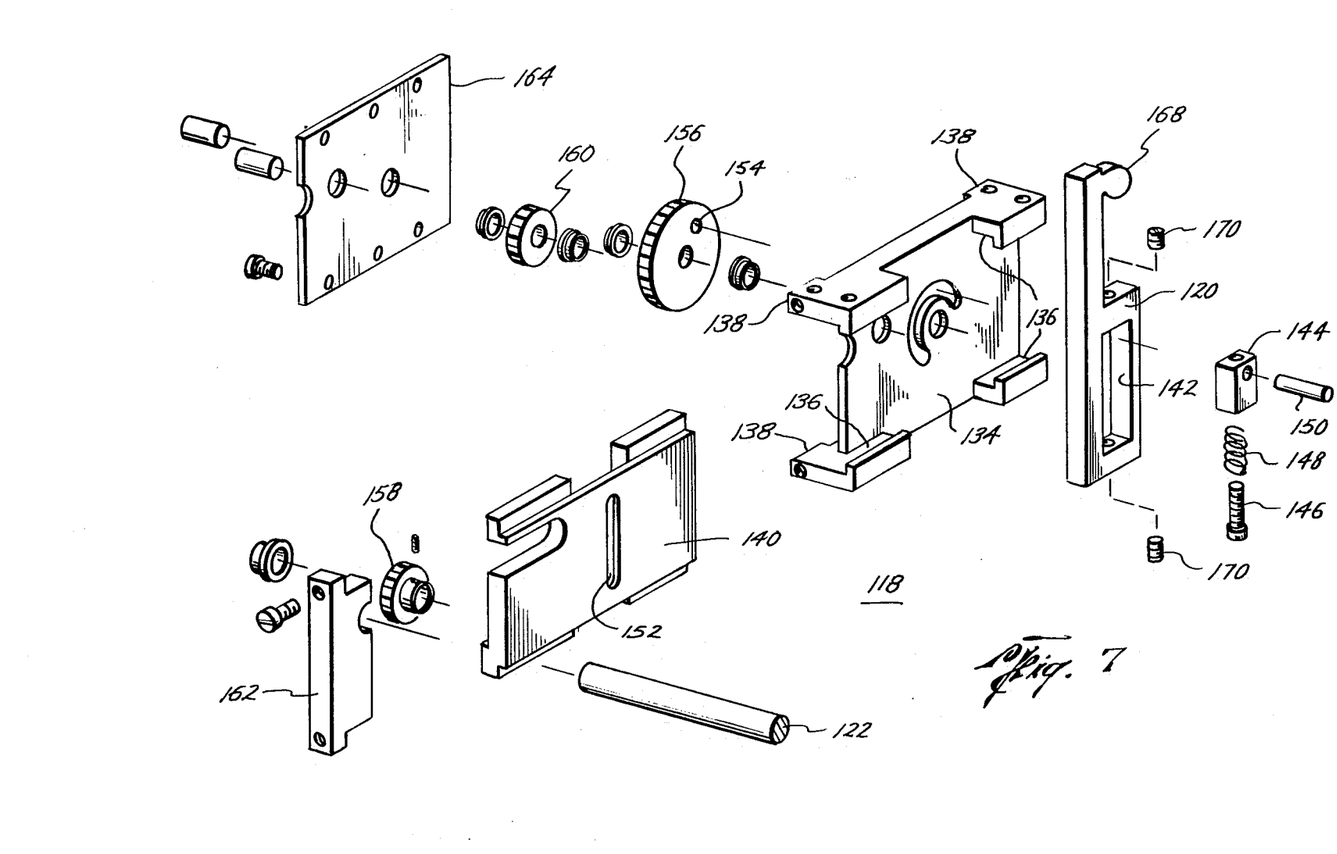
FIG. 7 is an exploded view of a pull-down finger assembly.

FIG. 7 illustrates a mechanical pull-down finger assembly 118. A main frame 134 has a pair of channels 136 along two of its sides. Each channel 136 has a flange 138 on its opposite face. A slide block 140 is free to move in the channels 136. The slide block 140 retains a finger 120. The finger 120 has a finger slot 142 in which a pivot block 144 is free to move. A spring retainer 146 in the slot 142 retains a spring 148 which biases the pivot block 144 to the top end of the slot 142. The pivot block 144 has a dowel pin 150 which extends through the pivot block 144 in sliding engagement and protrudes from both sides of the pivot block 144. A first end of the dowel pin 150 extends into a slide block slot 152 in a side of the slide block 140. A second end of the dowel pin 150 extends into a hole 154 on a side of a final drive gear wheel 156.

A driving gear wheel 158 and an intermediate gear wheel 160 mesh with the final drive gear wheel 156. A shaft retainer 162 attaches to the main frame 134 retaining the shaft 122 which is rigidly attached to the driving gear wheel 158. Rotating the shaft 122 turns the gear wheel 158, which turns the gear wheels 156 and 160. The final drive gear wheel 156 moves the dowel pin 150 and, consequently, the pivot block 144. The pivot block 144 moves the finger 120. A back plate 164 attaches to the flanges 138 on the face of the main frame 134 to form a cavity enclosing the meshed gears 156, 158, 160.

Figure 15:
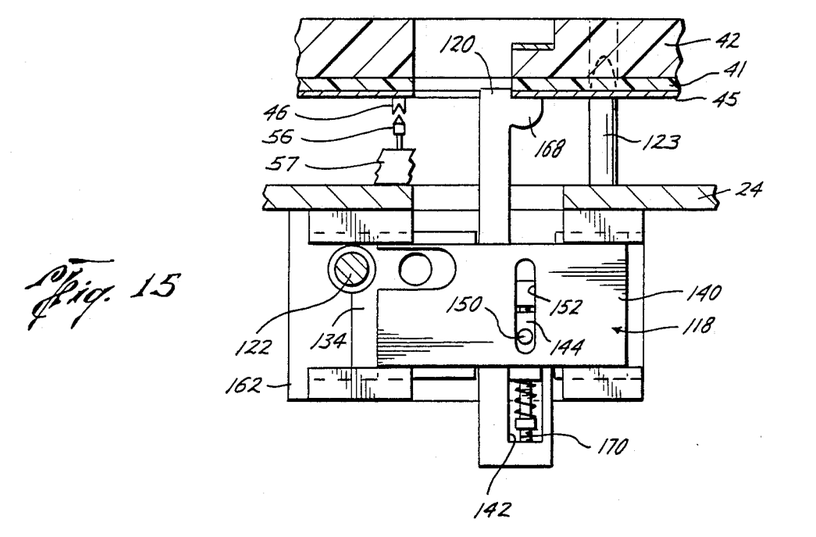
FIG. 15 depicts a pull-down finger supporting the test fixture assembly.
Figure 16:
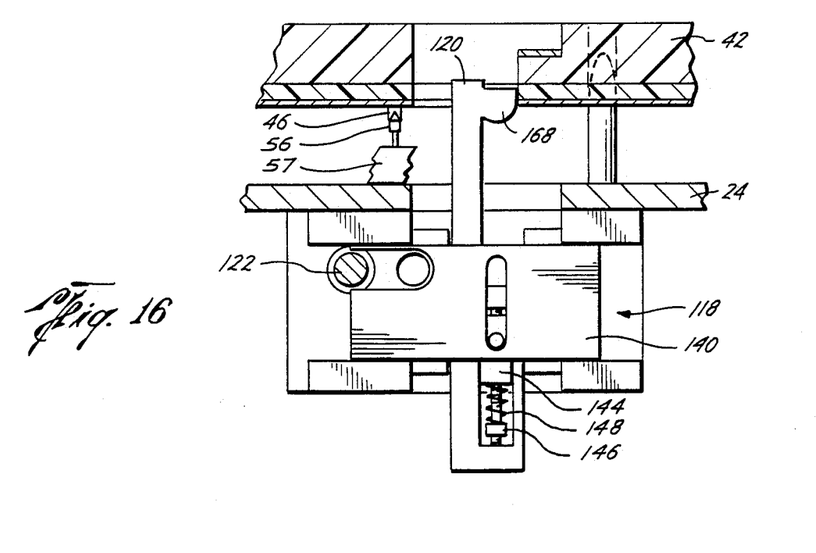
FIGS. 16 and 17 illustrate a pull-down finger after having released the test fixture assembly and having continued its rotational movement.
Figure 17:
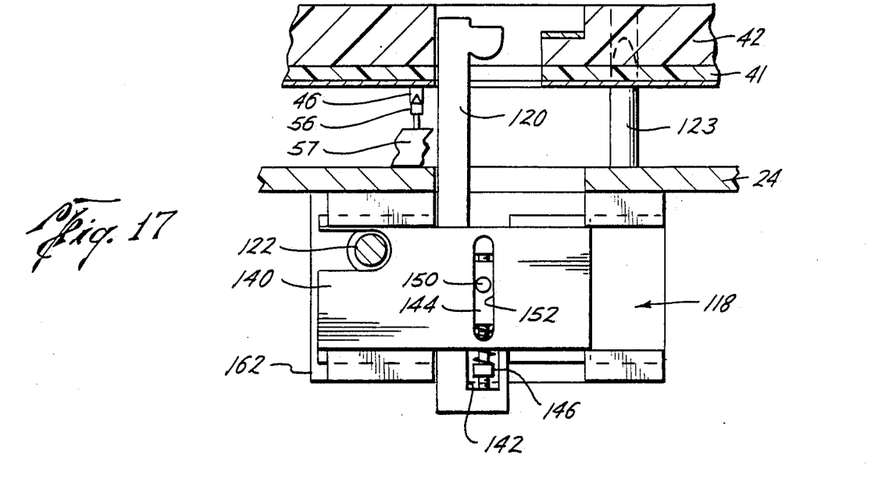
Figure 18:
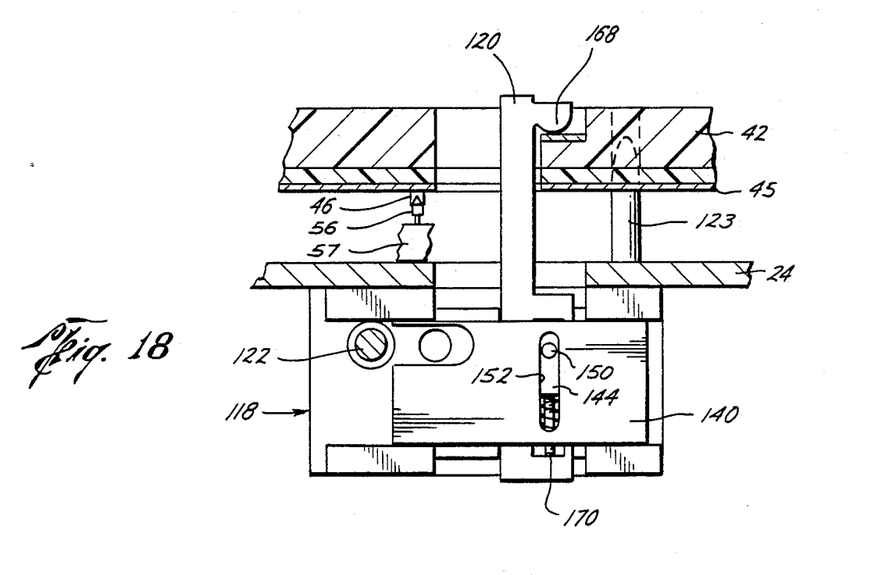
FIG. 18 depicts a pull-down finger at the end of its rotational movement, holding down the test fixture assembly, forcing an insulation displacement device to compress a spring-loaded probe.

Referring now to FIGS. 2 and 14, the test fixture assembly 21 at each of its four corners has a roller 166 to facilitate loading the test fixture assembly 21 onto the platen 24. The roller 166 at each corner simplifies movement of the assembly 21 to the desired location on the platen 24 with respect to the pull-down fingers 120 and platen alignment pins 167. Referring now to FIGS. 16 and 17, the platen alignment pins 167 locate the arrays of insulation displacement devices 46 precisely above the arrays of the driver/receiver probe connectors 56. Fingertips 168 of the fingers 120 support the test fixture assembly 21 and hold the arrays of insulation displacement devices 46 away from the arrays of the driver/receiver probe connectors 56, as illustrated in FIG. 15. The fingers 120 allow the test fixture assembly 21 to drop down onto the platen alignment pins 167. Referring now to FIG. 18, the fingers 120 in their final position hold the test fixture assembly 21 down onto the driver/receiver probe connectors 56, causing each driver/receiver probe connector to make firm electrical contact with its associated insulation displacement device 46.

Travel stops 169 located beneath the stiffener frame 42 prevent over-compression of the driver/receiver probe connectors 56 by the test fixture assembly 21. Each finger 120 in its final position compresses its respective spring 148. The spring 148 absorbs any further movement forced on the pivot block 144. Set screws 170 adjust the position of the pivot block 144 and the amount of tension in the spring 148.

In operation, a technician wires a separate test fixture assembly 21 for each different layout of a printed circuit board 50 to be tested. Before he wires a test fixture assembly 21, the technician must know the position of the nodes on the printed circuit board to be tested. The technician then inserts spring-loaded pogo probe connectors 47 through the appropriate holes in the test fixture 40. The bottom end of each spring-loaded probe connector 47, protruding through the test fixture ground plane 44, is the wire-wrap post 52. After first stripping back insulation from insulated conductors 172, the technician wraps the conductors 172 to the wire-wrap posts. The other end of each insulated conductor 172 is connected to its associated insulation displacement device 46 by the shortest path between the wire-wrap post 52 and the insulation displacement device 46. In making the connection to an insulation displacement device 46 the technician simply presses the insulated conductor 172 into the insulation displacement device. The insulation displacement device cuts the insulation to make an electrical and mechanical connection with the conductor. The insulated conductors 172 are all placed as close as possible to the test fixture ground plane 44 to reduce cross-coupling between the conductors 172.

Signal output drivers which send the test signal to the printed circuit board under test are located on the driver/receiver boards 36. These signal output drivers are situated as near as possible to the card-edge connector 34 which connects to the driver/receiver connector 26. Similarly, signal receiving devices which condition the signals received from the printed circuit board under test are likewise located on he driver/receiver boards 36 as near as possible to the card-edge connector 34 which connects to the driver/receiver connector 26. Consequently, the electrical signal path lengths between the driver/receiver board and the test fixture are made as short as possible. Making the signal paths short and running the insulated conductors 172 next to the test ground fixture plane 44 reduces the cross-coupling capacitance between the signal carrying wires, improving system frequency response and reducing signal distortion.

In the preferred embodiment of the invention, the back plane assembly 22 of the cabinet 20 supports seventy driver/receiver printed circuit boards. However, the back plane could be easily designed to support more driver/receiver boards.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. Apparatus for testing printed circuit boards comprising:
   (a) a cabinet for housing two rows of driver/receiver circuit boards in vertically disposed, side-by-side relation;
   (b) a separate multi-channel driver/receiver connector mounted on the upper edge of each driver/receiver circuit board to form two rows of driver/receiver connectors, each driver/receiver connector having a separate pogo probe for each channel, each pogo probe having:
      (i) a probe at a first end to mate with an insulation displacement device, and
      (ii) a contact at a second end to mate with a contact on a driver/receiver board;
   (c) a platen adapted to fit over the cabinet and the driver/receiver connectors, and having a top surface and a bottom surface and two opposite sides corresponding to the two sides of the cabinet;
   (d) a plurality of pull-down assemblies mounted along each side of the platen, each pull-down assembly located between driver/receiver connectors, each pull-down assembly including a pull-down member which is vertically movable between a first extended position and a second retracted position relative to the platen;
   (e) reversible drive means connected to the pulldown assemblies and operable to move the pulldown members in unison between the first and second positions;
   (f) a test fixture assembly comprising a central test fixture having top and bottom planar surfaces and two fixture interfaces attached to opposite sides of the central test fixture; the test fixture assembly configured to fit over the platen with each fixture interface positioned over a corresponding row of pull-down assemblies and driver/receiver connectors, the top planar surface adapted to receive the solder side of a printed circuit board; and each fixture interface having an upper surface and a lower surface;
   (g) a plurality of pogo probe connectors mounted in the test fixture, each probe connector having a probe end adapted to contact the solder side of a printed circuit board received on the top planar surface, and each probe connector having a wire-wrap post extending below the test fixture;
   (h) rows of insulation displacement devices mounted on the lower surface of each fixture interface, a separate such row being vertically above and aligned with each driver/receiver connector; and
   (i) a plurality of conductors mounted on the bottom planar surface of the test fixture, each conductor connecting one wire-wrap post with one insulation displacement device.

2. The apparatus of claim 1 in which the bottom planar surface of the test fixture comprises a ground plane and the conductors are insulated.

3. The apparatus of claim 1 in which each pull-down member comprises a pull-down finger which extends vertically and terminates at its upper end in a tip extending laterally inward relative to the platen.

4. The apparatus of claim 3 in which each finger moves laterally outwardly and then inwardly upon vertical movement between said first extended position and said second retracted position.

5. The apparatus of claim 4 in which the fingers are capable of supporting a test fixture assembly on their fingertips when in their first extended position, and move sufficiently laterally outward upon movement to their second retracted position to enable the test fixture assembly to drop between the fingertips.

6. The apparatus of claim 1 in which the pull-down members extend above the test fixture assembly when the test fixture assembly is fitted over the platen, and the pull-down members are operable to pull the test fixture assembly against the platen upon downward movement of the pull-down members.

7. Apparatus for testing a printed circuit board against a test circuit board, comprising:
(a) A test fixture assembly including a central test fixture having a top planar surface and a bottom planar surface, and two fixture interfaces attached to opposite lateral sides of the test fixture member; the top planar surface configured to receive a solder side of a printed circuit board;
(b) a pogo probe connector mounted in the test fixture member including a plurality of pogo probes, each having a first probe end projecting above the top planar surface and a second contact end projecting below the bottom planar surface;
(c) a platen positioned below the test fixture assembly;
(d) an insulation displacement device mounted in one of the fixture interfaces and facing toward the platen;
(e) a conductor connecting said contact end of said pogo probe connector with said insulation displacement device;
(f) a driver/receiver connector mounted in the platen and comprising a pogo probe connector including a plurality of pogo probes, each having a probe end projecting above the platen to frictionally engage with said insulation displacement device, and a contact end extending below the platen and configured to frictionally engage with an edge connector of a test circuit board; and
(g) a mechanical pull down system mounted on the platen in vertically movable relation between a first position above the test fixture assembly and a second position spaced from the first position toward the platen; the mechanical pull down system configured and operable to pull the test fixture assembly toward the platen upon movement of the mechanical pull down system from the first position to said second position.

8. The apparatus of claim 7 in which the pull down system comprises a plurality of pull down assemblies, each assembly including a finger extending from the platen above the test fixture and including a fingertip extending laterally inward relative to the platen and the test fixture.

9. A multi-channel electrical connector for electrically connecting a plurality of multi-contact cards placed within a test system to a customized test fixture adapted for testing a printed circuit board comprising:
at least one driver/receiver connector locatable intermediate said test fixture and said plurality of multi-contact cards; each said connector having an insulating body with two substantially parallel opposed surfaces;
a separate electrical conductor mounted within said body for each separate channel of a plurality of electrical channels;
a pogo-type probe connector having a separate pogo-type probe for each said conductor mounted in said body, each pogo-type probe having a contact end connected to a first end of a respective conductor and a probe end, said probe end extending beyond a first of said opposed surfaces and capable of frictional engagement with said test fixture; and
a multi-contact card connector mounted on a second of said opposed surfaces, capable of frictional engagement with said multi-contact cards.

10. The connector of claim 9 in which the card connector is a socket type.

11. The connector of claim 9 in which the card connector is a plug type.

12. The connector of claim 9 in which the conductors are wires and generally perpendicular to said opposed surfaces.

13. A connector for printed circuit boards comprising:
a test fixture assembly having vertically opposed first and second planar surfaces;
a plurality of insulation displacement devices mounted on the first planar surface of said test fixture assembly;
a driver/receiver connector having opposed first and second surfaces;
a multiple-contact card-edge connector mounted on the first surface of said driver/receiver connector;
a plurality of compressible probes mounted in said driver/receiver connector with probe ends of the probes protruding from the second surface of said driver/receiver connector when the probes are extended, each probe end being configured to connect electrically with the insulation displacement devices; and
a separate electrical connection within the driver/receiver connector for each probe, connecting each probe with a separate electrical contact in the card-edge connector.

14. The connector of claim 13 in which the electrical connection is a length of conductor wire.

15. The connector of claim 13 in which the card-edge connector is a socket type.

16. The connector of claim 13 in which the card-edge connector is a plug type.

17. A test fixture assembly for testing printed circuit boards, comprising:
(a) an insulator test fixture having opposed top and bottom planar surfaces, the top planar surface configured to receive a solder side of a printed circuit board;
(b) a plurality of pogo-type probes mounted in said test fixture, each said probe having a probe end projecting beyond said top surface when in an extended condition, and a wire-wrap end projecting beyond said bottom surface;

(c) a separate fixture interface attached to each of two opposite sides of said test fixture and having a planar bottom surface;

(d) a separate plurality of insulation displacement devices mounted on each said bottom surface of said interface;

(e) a plurality of electrical conductors interconnecting said wire-wrap ends with respective insulation displacement devices; and (f) a plurality of driver/receiver connectors configured below said insulator test fixture, each said connector having a plurality of compressible probes for frictionally engaging said plurality of insulation displacement devices.

18. The test fixture assembly of claim 17 wherein the bottom planar surface of the test fixture is a ground plane and the electrical conductors are insulated.

19. The test fixture assembly of claim 17 in which the insulation displacement devices are mounted in linear arrays.

20. In a device having a cabinet for housing at least one row of circuit boards, a separate multi-channel connector frictionally engaged on the upper edge of each circuit board to form rows of multi-channel connectors, each multi-channel connector having on its top surface a separate compressible connector for each channel, each compressible connector having a probe at a first end thereof, an apparatus comprising:

(a) a platen attached to the top of the cabinet and fitting over the multi-channel connectors, and having a top surface and a bottom surface on two opposite sides;

(b) fixture interfaces attached to the platen and positioned over the rows of the multi-channel connectors, each fixture interface having an upper surface and a lower surface;

(c) rows of contacts mounted on the lower surface of each fixture interface configured to receive the rows of multi-channel connectors, a separate such row being vertically above and aligned with each row of multi-channel connectors, each said contact configured to receive a respective compressible connector;

(d) a plurality of pull-down assemblies mounted along each side of the platen each pull-down assembly located between the multi-channel connectors, each pull-down assembly including a pull-down member which is vertically movable between a first extended position and a second retracted position relative to the platen; and (e) reversible drive means connected to the pull-down assemblies and operable to move the pull-down members in unison between the first and second positions.

* * * * *